(12) United States Patent
Cooke

(10) Patent No.: US 8,907,707 B2
(45) Date of Patent: Dec. 9, 2014

(54) ALIGNING MULTIPLE CHIP INPUT SIGNALS USING DIGITAL PHASE LOCK LOOPS

(71) Applicant: Laurence H. Cooke, Los Gatos, CA (US)

(72) Inventor: Laurence H. Cooke, Los Gatos, CA (US)

(*) Notice: Subject to any disclaimer, the term of this patent is extended or adjusted under 35 U.S.C. 154(b) by 0 days.

(21) Appl. No.: 14/188,062

(22) Filed: Feb. 24, 2014

(65) Prior Publication Data

US 2014/0247076 A1 Sep. 4, 2014

Related U.S. Application Data

(63) Continuation-in-part of application No. 14/075,084, filed on Nov. 8, 2013, now Pat. No. 8,692,596, which is a continuation of application No. 13/781,925, filed on Mar. 1, 2013, now Pat. No. 8,593,191.

(51) Int. Cl.
*H03L 7/06* (2006.01)
*H03L 7/08* (2006.01)

(52) U.S. Cl.
CPC .................................... *H03L 7/08* (2013.01)
USPC ......................................... 327/158; 327/147

(58) Field of Classification Search
USPC .................................................. 327/147, 158
See application file for complete search history.

(56) References Cited

U.S. PATENT DOCUMENTS

| | | | |
|---|---|---|---|
| 4,795,985 A | 1/1989 | Gailbreath, Jr. | |
| 5,259,004 A * | 11/1993 | Nakayama | 375/354 |
| 5,631,591 A | 5/1997 | Bar-Niv | |
| 5,982,213 A | 11/1999 | Schenck et al. | |
| 6,577,174 B2 * | 6/2003 | Locker et al. | 327/141 |
| 6,771,096 B1 | 8/2004 | Meyers et al. | |
| 7,239,651 B2 * | 7/2007 | Gilsdorf | 370/503 |
| 7,256,628 B2 | 8/2007 | Drost et al. | |
| 7,368,962 B2 | 5/2008 | Nakamuta et al. | |
| 8,134,412 B2 | 3/2012 | Karabatsos | |
| 8,320,212 B2 * | 11/2012 | Kim et al. | 365/226 |
| 8,589,643 B2 * | 11/2013 | Meyer et al. | 711/158 |
| 8,593,191 B1 | 11/2013 | Cooke | |
| 2004/0095861 A1 * | 5/2004 | Hsu et al. | 369/47.28 |
| 2004/0164776 A1 * | 8/2004 | Zampetti et al. | 327/156 |
| 2009/0115479 A1 * | 5/2009 | Gomm et al. | 327/161 |
| 2011/0057698 A1 * | 3/2011 | Gomm et al. | 327/161 |
| 2011/0291718 A1 * | 12/2011 | Lee | 327/158 |
| 2012/0274376 A1 * | 11/2012 | Gomm et al. | 327/158 |
| 2013/0249612 A1 * | 9/2013 | Zerbe et al. | 327/161 |

* cited by examiner

*Primary Examiner* — Adam Houston
(74) *Attorney, Agent, or Firm* — Panitch Schwarze Belisario & Nadel LLP

(57) ABSTRACT

This disclosure describes methods and techniques using Digital Phase Lock Loops (DPLLs) within a source chip to automatically phase align a plurality of signals at a plurality of pins on a plurality of target chips of varying distances and corresponding delays from the source chip by using each transmitted signal's reflected signal as a tuning reference. It also describes using these techniques to align signals fed back from the target chips to the source chip.

8 Claims, 9 Drawing Sheets

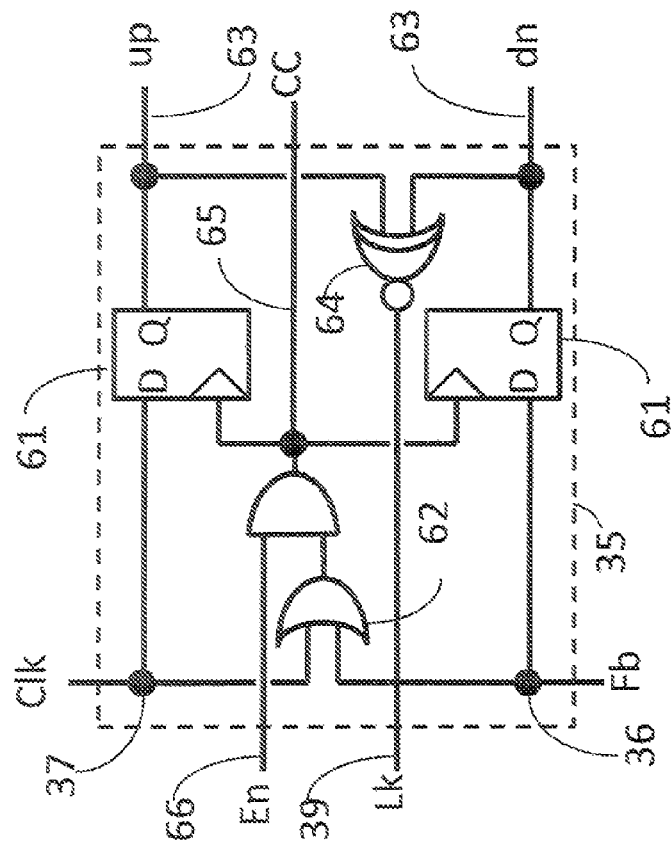
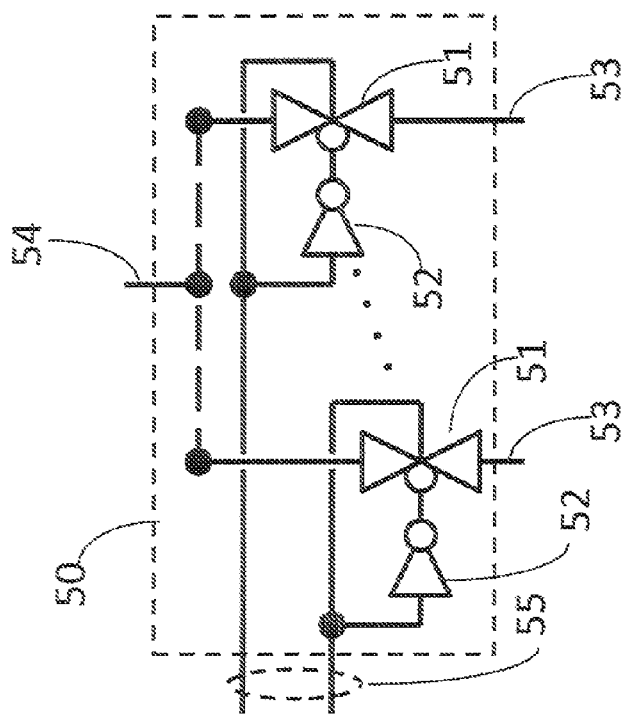
Figure 6
Figure 5

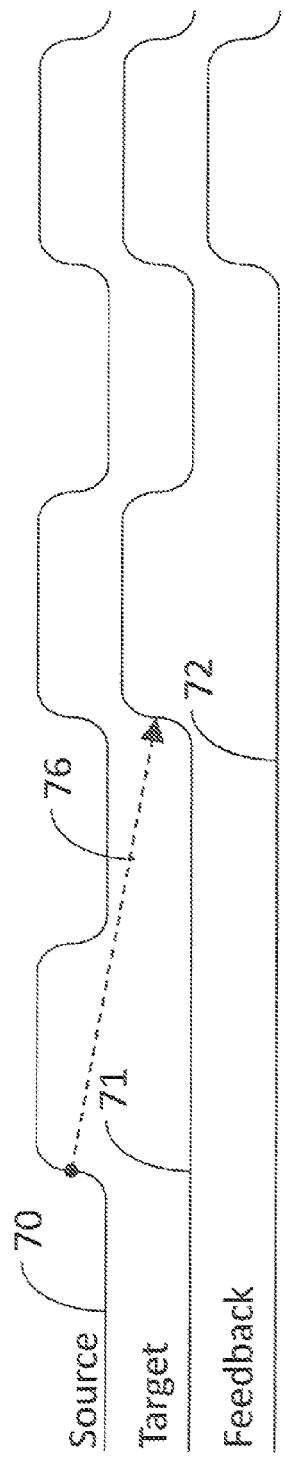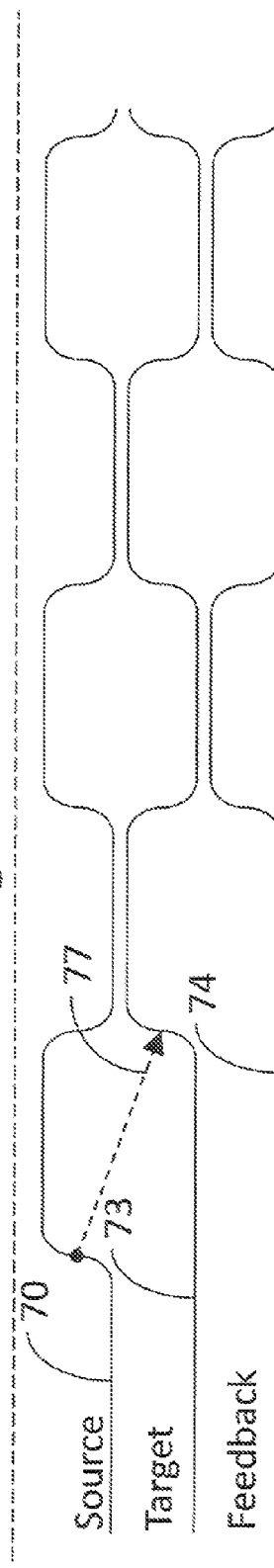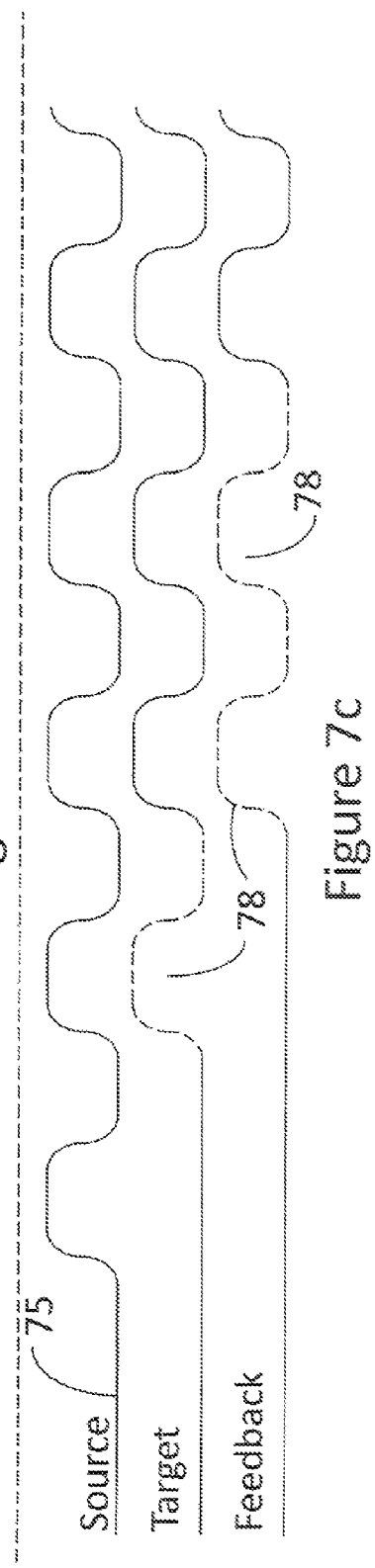
Figure 7a
Figure 7b
Figure 7c

ALIGNING MULTIPLE CHIP INPUT SIGNALS USING DIGITAL PHASE LOCK LOOPS

This application is a continuation-in-part of U.S. application Ser. No. 14/075,084, filed Nov. 8, 2013, which is a continuation of U.S. application Ser. No. 13/781,925, filed on Mar. 1, 2013, both of which are incorporated by reference herein in their entireties.

FIELD OF THE INVENTION

Embodiments of the present invention may pertain to multiple digital phase lock loops on multiple chips used to align input signals without an external reference.

BACKGROUND OF THE INVENTION

Digital Phase Lock loops (DPLLs) are typically used to align chip internal clocks to a master input clock as shown in U.S. Pat. No. 4,795,985, granted Jan. 3, 1989 to Gailbreath, Jr. A digital phase lock loop may include a digital variable delay line and control logic to modify the digital variable delay line with up/down signals, which may be derived by comparing an input signal with a reference signal. Numerous examples of such DPLL functions exist, including U.S. Pat. No. 6,771,096, granted Aug. 3, 2004 to Meyers et al., which covers one form of control logic, and U.S. Pat. No. 5,982,213 granted Nov. 9, 1999 to Schenck et al., which describes a combination of buffers and switching capacitance to form a digital variable delay line.

DPLLs may be used to align the chip outputs to the master input clock as shown in U.S. Pat. No. 8,134,412, granted Mar. 13, 2012 to Karabatsos, or to synchronize the clocks from multiple units within a chip as described in U.S. Pat. No. 7,368,962 granted May 6, 2008 to Nakamuta et al. DPLLs may also be used to synchronize clocks between multiple chips. In U.S. Pat. No. 5,631,591 granted May 29, 1997, Bar-Niv describes synchronizing bus clock outputs from two chips, and in U.S. Pat. No. 7,256,628 granted Aug. 14, 2007, Drost et al. describe synchronizing multiple chip's internal clocks; but in both cases, dedicated external clock or reference signals are needed to perform such synchronization. In order to ensure the sourced clocks are properly aligned, the reference signals may require careful board level layout to avoid creating uncorrectable differences in the synchronization circuitry. It would therefore be desirable to independently align the source to each of a plurality of chips in a system without the need for such external reference signals.

SUMMARY OF EMBODIMENTS OF THE INVENTION

This disclosure describes methods and techniques that may use DPLLs within a clock distribution block in a chip to automatically phase align a plurality of clock signals at a plurality of clock pins on a plurality of target chips of varying distances and delays from the clock distribution block without the use of additional external reference signals.

To accomplish this, the wires connected from the clock distribution block through the chip's output clock pins to the target chip clock pins may be connected as point to point connected un-terminated transmission lines with half the impedance of the output clock drivers on the clock distribution block. The output clock pins on the edge of the clock distribution block may also be connected to high threshold input buffers, such that the return reflection of the clock, not the original signal, triggers the input buffer that, in turn, may generate feedback signals back into the clock distribution block.

As a result the feedback signal and the original source clock may be delayed through two identically set variable delay lines such that the clock signal at a target chip's clock pin transitions at exactly ½ of the delay in the total feedback loop. By using a ½ frequency clock to obtain an initial lock, and re-locking after transitioning to a full frequency clock, the proper edge of the clock at each target chip's clock input may transition synchronously with the all the other target chip clock inputs.

In addition, the clock distribution block may align data output signals, and a signal distribution block may align data input signals from the plurality of target chips, both of which may then be used to align the performance of the plurality of target chips.

In yet another embodiment, input signals from the target chips may be aligned in the same manner as the clocks and other data outputs, and thereafter, the aligned input signals may be captured at the feedback from their respective digital variable delay lines. Test signals captured from a plurality of identically functioning target chips may then be used to adjust the performance of each of the plurality of target chips, e.g., by varying the target chips' power supply voltages, thereby aligning the plurality of target chips' output signals.

BRIEF DESCRIPTION OF THE DRAWINGS

Embodiments of the invention will now be described in connection with the attached drawings, in which:

FIG. 5 is a diagram of an example of a transmission gate multiplexor, FIG. 6 is a diagram of an example of control logic, FIG. 7a is a diagram of phase alignments of a ½ frequency clocks, FIG. 7b is another diagram of phase alignments of ½ frequency clocks, FIG. 7c is a diagram of phase alignments of full frequency clocks.

DESCRIPTION OF VARIOUS EMBODIMENTS

Various embodiments of the present invention are now described with reference to FIGS. 1-12, it being appreciated that the figures illustrate various aspects of the subject matter and may not be to scale or to measure.

Figure 1:
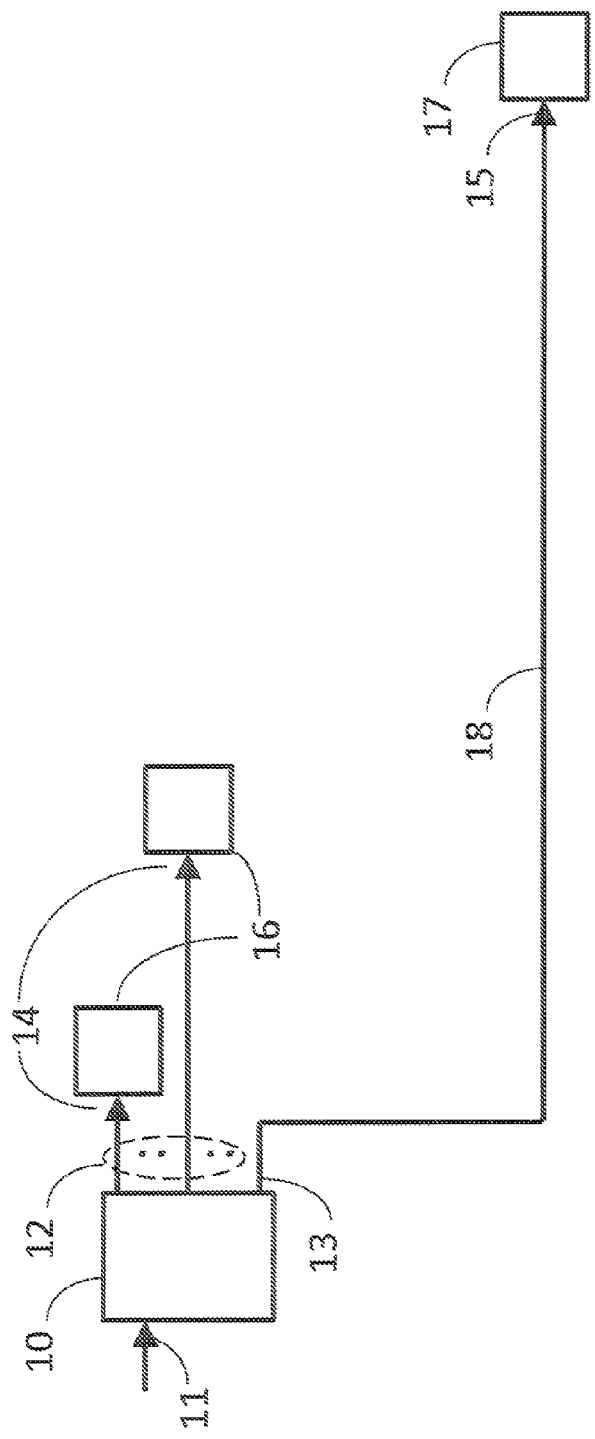
FIG. 1 is a diagram of a chip containing a clock distribution block and its connections to a plurality of target chips, in accordance with a disclosed embodiment.

An embodiment of the present invention may be incorporated into a multi-chip digital system as shown in FIG. 1. A chip 10 containing a clock distribution block may receive a master clock signal on its input 11, which it may distribute via the clock distribution block to clock outputs 12,13 through point to point un-terminated transmission lines to the clock inputs 14,15 of a plurality of target chips 16,17. The master clock signal may be generated using a crystal or other well-known techniques.

Figure 2:
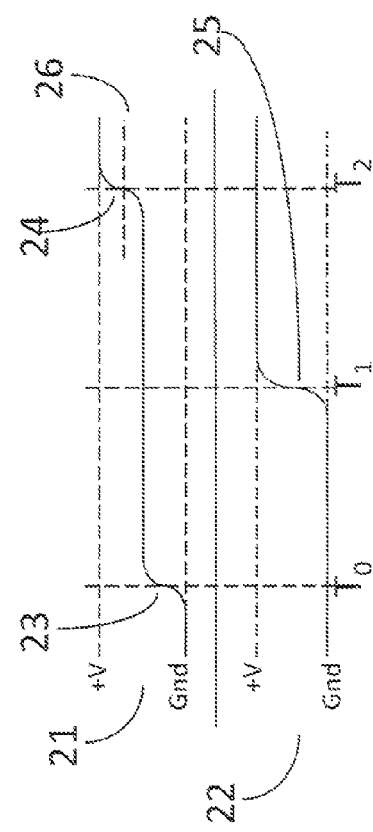
FIG. 2 is a signal transition diagram corresponding to signals at two different points on a connection in FIG. 1, in accordance with a disclosed embodiment.

Reference is now made to FIG. 2, a signal transition diagram at both the source and the target of a point-to-point un-terminated transmission line, for example, points 13 and 15 on connection 18 in FIG. 1. The top waveform 21 shows an example of the transition of a rising edge of a signal at its source 13 in FIG. 1 on a transmission line 18 in FIG. 1, where the output driver has twice the impedance of the transmission line. As a result, the current out of the output driver may be sufficient to initially bring the voltage on the output up to a voltage midway between ground and +V at an initial time $T_0$ 23. This signal may then propagate up to one foot per nanosecond, reflecting off the un-terminated end of the transmission line at the target 15 in FIG. 1. The reflected signal may then traverse back to the source 13, where the signal may cause the voltage to rise from the mid voltage to +V at time $T_2$ 24. The bottom waveform 22 shows the transition of this reflected signal at the target 15. The signal arrives at the target and reflects back toward the source, transitioning from Gnd to +V at a time $T_1$ 25, which is midway between time $T_0$ and $T_2$.

Figure 3:
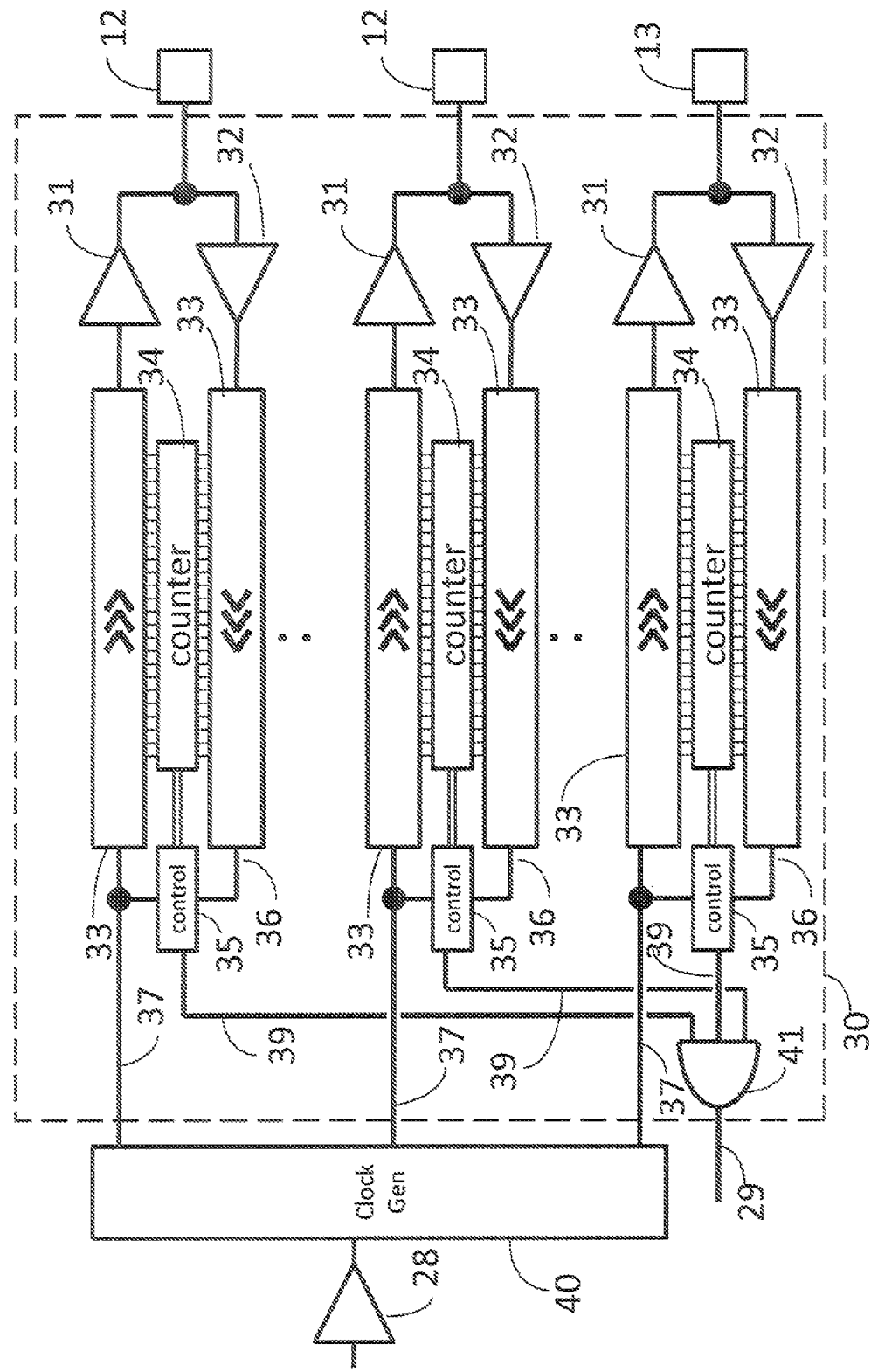
FIG. 3 is a top level diagram of a clock generator block and a clock distribution block according to a disclosed embodiment.

Reference is now made to FIG. 3, a top level diagram of an example of a clock distribution block 30. Each clock output 12,13 on the chip may be connected to a clock driver 31 and a high threshold clock input buffer 32 in the clock distribution block 30. The input buffers 32 may transition high at a voltage that may be ¾ of +V at a voltage level 26 on the waveform 21 in FIG. 2, which may correspond to the center of the voltage transition of the reflected signal 24. Each of the clock drivers 31 may be driven by a digital variable delay line 33, and the clock input buffers 32 associated with the respective clock drivers 31 may also drive digital variable delay lines 33. Furthermore, each pair of digital variable delay lines 33 associated with a clock output pin may be controlled by a common counter 34, such that they may maintain the same propagation delay. The count from each counter 34 may determine the delay of the pair of digital variable delay lines 33 associated with that particular counter 34. Each counter 34 may be controlled by a control circuit 35, which may compare a feedback signal 36 from one of the digital variable delay lines 33 controlled by the control circuit 35 with a source clock signal 37 from a clock generator block 40. The clock generator block 40 may receive a clock input signal from buffer 28, which may be connected to a chip input (11 in FIG. 1). Each controller 35 may also output a lock signal 39. The lock output 29 may be determined as the AND 41 of all the lock signals 39, and may indicate that all the clocks of clock distribution block 30 are locked.

Figure 4:
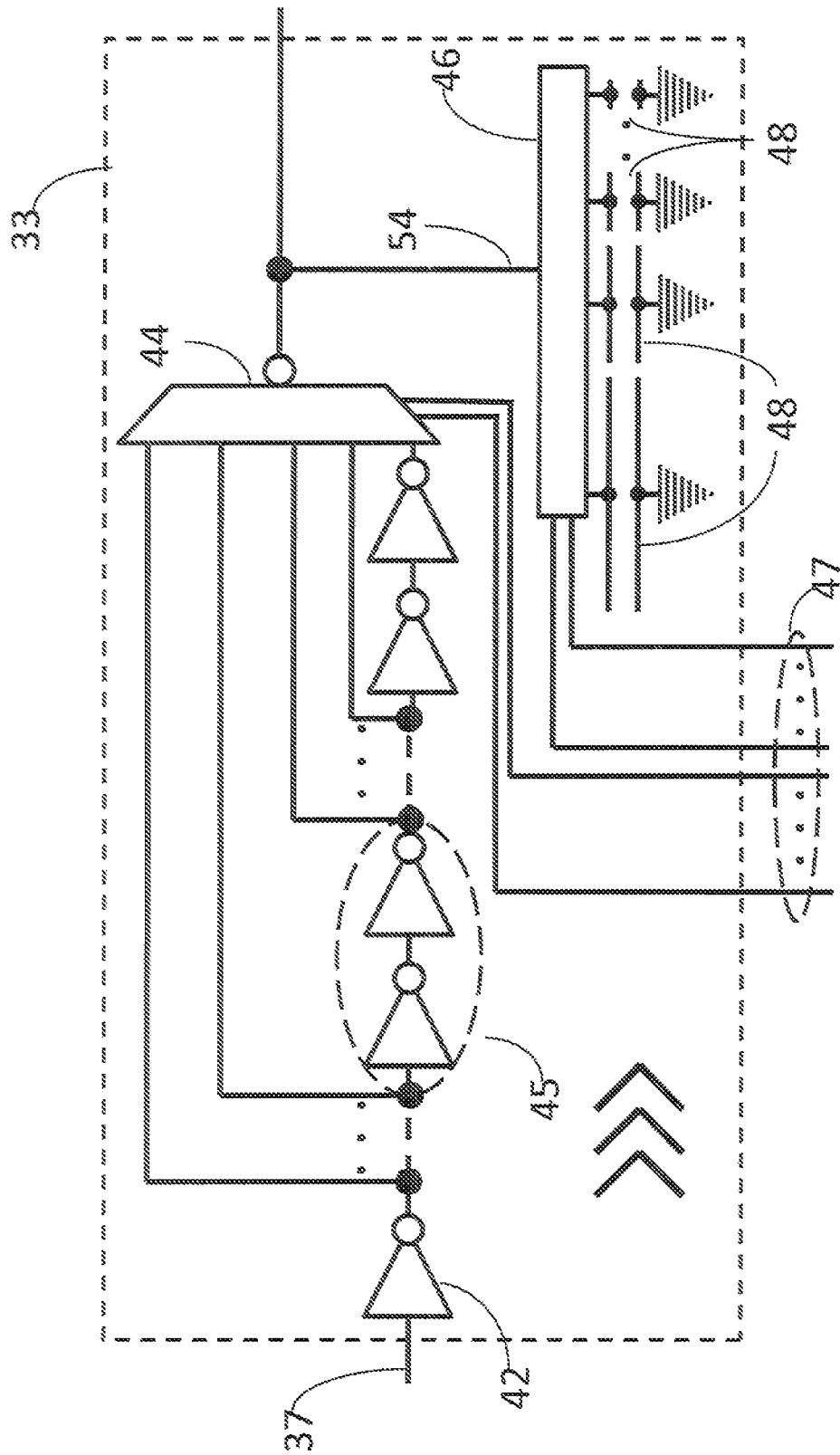
FIG. 4 is a diagram of a digital variable delay line according to a disclosed embodiment.

Reference is now made to FIG. 4, a diagram of an example of a digital variable delay line 33. A digital variable delay line 33 may include a transmission gate multiplexor 46 for selecting from multiple capacitances 48, and a string of multiple inverter pairs 45, the number of which may be selected by a multiplexor 44. Together, the control lines 47 for selecting the number of inverter pairs 45 and the transmission gate multiplexor 46 may serve to determine the propagation delay of the digital variable delay line 33. Typically, each of the capacitors 48 may be a unique power of 2 in size, such that together they may form a delay at least equal to one of the inverter pairs. In this fashion, delays may be selected on the digital variable delay line 33 from a minimum equal to the delay of the inverter 42, the multiplexor 44 and transmission gate multiplexor 46, with no capacitance selected, up to the maximum delay of all inverter pairs 45 and the maximum capacitance loading, with a minimum increment equal to the delay induced by the smallest selected capacitance 48.

Reference is now made to FIG. 5, a diagram of an example of a transmission gate multiplexor 50, which may include multiple transmission gates 51 with their associated inverters 52, which may connect the digital variable delay line output 54 to the capacitance connections 53, based on the state of the address lines 55.

Reference is now made to FIG. 6, a diagram of an example of control logic 35, which may include a pair of flip-flops 61, each of which may capture the source clock signal 37 and feedback signal 36 states based on the OR 62 of both signals, the earliest of both clocks delayed by the setup time of the flip-flops, to act as a comparator of the differences between the source clock and feedback signals. As a result, when the enable signal 66 is high, the flip-flops may capture either the same values, if the source clock signal 37 and feedback signal 36 are aligned, or different values, if they are not aligned. These values may be outputted 63 to the counter 34 to signal it to count up or count down on the next count clock 65. When the outputs are the same, the lock signal 39 may transition high.

Now, given that each pair of digital variable delay lines 33 may be set to half of their maximum delay, the round trip time from the source clock signal 37 at the control logic to the feedback signal 36 at the control logic 35 would be twice a digital variable delay line delay plus the twice the transition time from the clock distribution block 30 to the target chip's clock input 14,15. By operating the clock distribution block 30 until the lock output 29 goes high, the round trip delay for each target chip's clock input 14,15 may change until they it equals one or more clock cycles. If the clock has a 50% duty cycle, all the target chip clocks may transition at the same time, but not necessarily in the same direction. If the round trip delay in the DPLL, with respect to a particular target chip, is an odd number of clock cycles, the transition at that target chip's clock input may be opposite to the transition at a target chip's clock input where the round trip delay in the DPLL is an even number of clock cycles.

Reference is now made to FIG. 7a is a diagram of phase alignments of ½ frequency clocks. In this case, after lock, the delay may be two full clock cycles between the source clock signal 70 and the feedback signal 72, and the target chip's clock signal 71 may be in phase 76 with the source clock signal 70.

Reference is now made to FIG. 7b, another diagram of phase alignments of ½ frequency clocks. In this case, after lock, the delay may be one full clock cycle between the source clock signal 70 and the feedback signal 74, and the target chip's clock signal 73 may be out of phase 77 with the source clock signal 70.

Therefore, in one embodiment a method to align all the target chip clock input signals may be:

a. Set all counters to ½ of their maximum count, b. Run a ½ frequency clock until the clock distribution block's lock output goes high, and c. Run a full frequency clock until the clock distribution block's lock output goes high.

Reference is now made to FIG. 7c, a diagram of phase alignments of full frequency clocks. After locking a ½ frequency clock, and then relocking a full clock, whether the feedback and target clock signals are one clock cycle apart or two clock cycles apart (with or without the clock pulses 78), the target chip's clock signal is always in phase.

Figure 8:
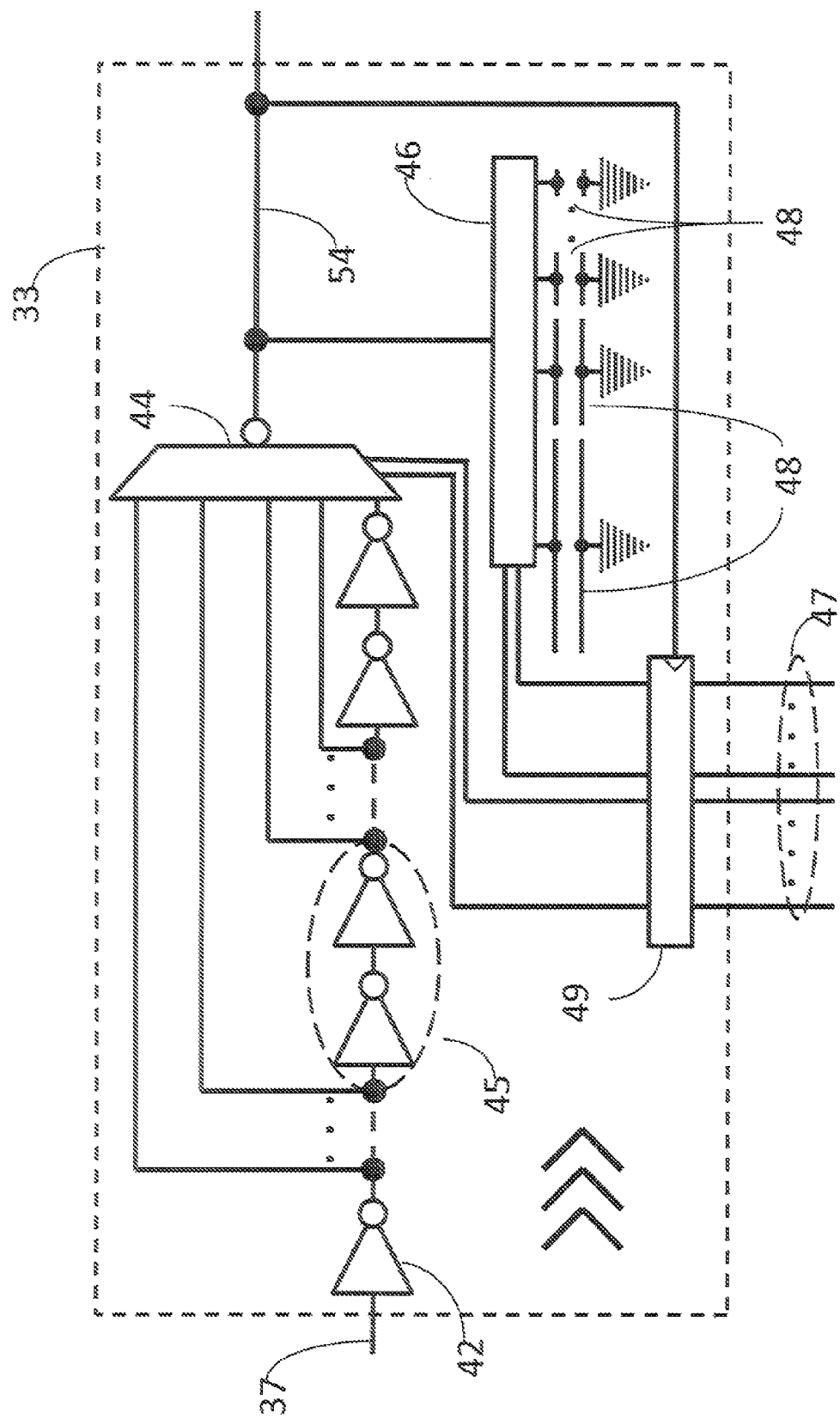
FIG. 8 is another diagram of an example of a digital variable delay line.

In another embodiment, delay in digital variable delay lines 33 may change after the last transition exits each digital variable delay line 33, which may reduce the generation of spurious clock pulses. Reference is now made to FIG. 8, showing another example of a digital variable delay line 33. The digital variable delay line control lines 47 may be captured in a register 49 and may be clocked by the output 54 of the digital variable delay line 33. In this manner, transitions due to changes in the digital variable delay line 33 may be minimized while signal transitions are propagating through the delay line 33.

Figure 9:
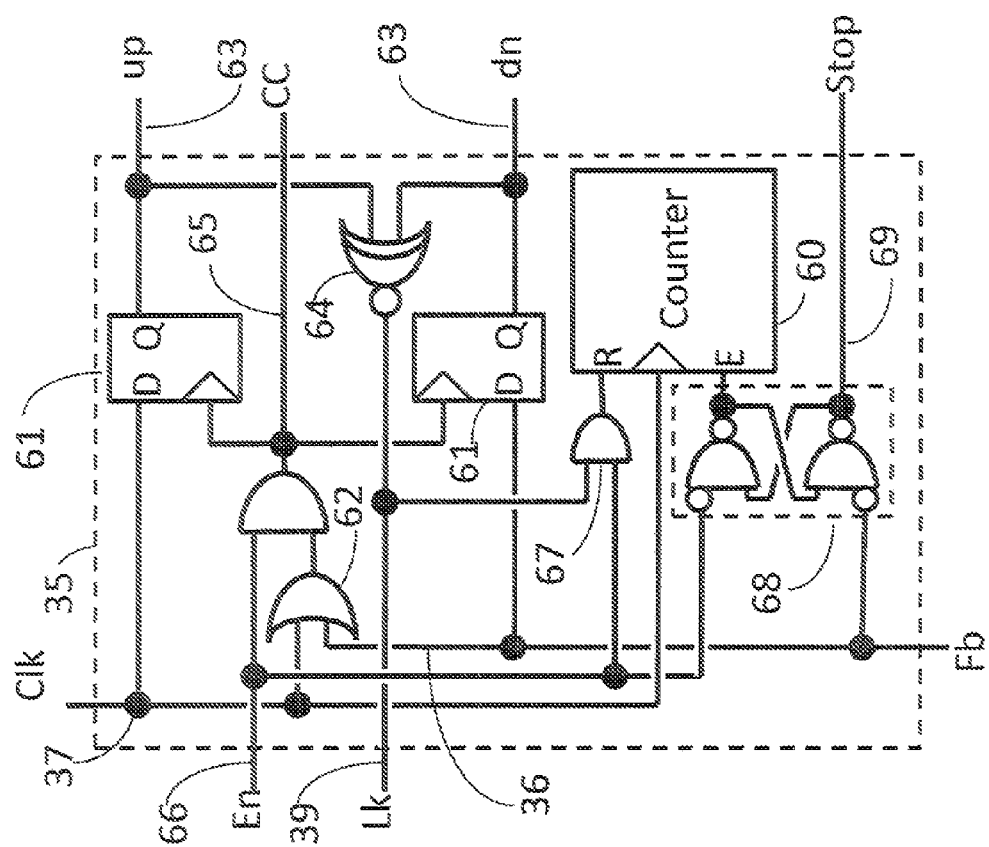
FIG. 9 is another diagram of an example of control logic.

In another embodiment, the number of clock cycles in each pair of locked digital variable delay lines 33 may be measured. Reference is now made to FIG. 9, another example of control logic 35. By setting the enable 66 low, locking the current state of the flip-flops 61, the source clock signal 37 may be turned off without affecting the lock signal 39. The counter 60 may be reset by the AND gate 67 when the enable signal 66 and the lock signal 39 are set high. When the enable signal 66 is set low, the counter 60 may count the clock pulses on the source clock signal 37, until the first clock pulse returns to the control logic 37 as the feedback signal 36, setting the stop signal 69 high, as can be seen by the operation of the set-reset function 68. In a fashion similar to the AND 41 of the lock signals 39 to form the lock output 29 in FIG. 3, the stop signals 69 may be ANDed together to form a stop output 94 in FIG. 10, such that the source clock signal 37 may be set low when the stop output 94 goes high. To summarize, the number of clock cycles on all pairs of digital variable delay lines 33 may be generated and read using the following procedure:

a. Apply clocks to all transmission lines with enables high until the lock output goes high.

b. Set the enables low and then set the source clock signal low.

c. Apply a positive pulse to all enables 66, and thereafter apply positive pulses to the source clock signal 37 until the stop output 94 goes high.

d. Read the contents of all the control logic counters 60.

Figure 10:
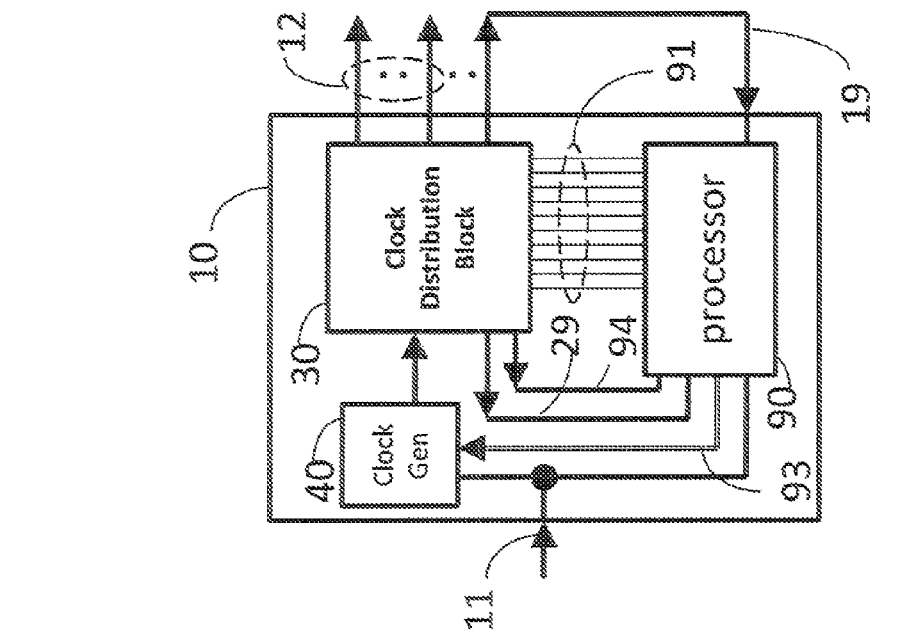
FIG. 10 is a diagram of a processor coupled to a clock distribution block.

In another embodiment of the invention, the clock distribution block 30 may reside with other blocks, including, e.g., a processor, in a chip where one clock output of the clock distribution block 30 is connected to a clock input pin for the at least one other component of the chip. Reference is now made to FIG. 10, a diagram of a chip 10, which contains a clock distribution block 30 that is coupled to a processor 90. In one mode, the processor 90 may be clocked by a clock output 19 from the clock distribution block 30, which may be tuned in the same manner as the other clock outputs 12. In another mode, the processor 90 may be clocked by the same master clock 11 that drives a clock generator block 40, which in turn may drive the clock distribution block 30. In this mode, the processor 90 may have read and write access to all the clock distribution block's counters 34 and control logic counters 60. The processor 90 may also have read access to all logic stop signals 69, as well as the lock output 29 of the clock distribution block 30, and may also have control of the control logic enables 66 and the clock generator block 40 through control signals 93.

To ensure the same number of clocks are issued to all the target chips, it may be useful when stopping and starting the master clock to have the same delay from the master clock to all the target chip clock inputs. In another embodiment, all the target chip clock inputs 14,15 may be tuned to a common number of clock cycles or delay. This may be accomplished by measuring the number of clock cycles in the loops between the control logic 35 and target chip clock input 12,13 for each transmission line and the delay of each transmission line's pair of digital variable delay lines 33. The amount of time a signal takes to traverse each transmission line may then be determined as the clock period times the number of clock cycles in the loop less twice the delay in the digital variable delay lines 33. The time plus twice the minimum digital variable delay rounded up to the nearest clock cycle may be considered to be the minimum delay that may be used. Once this minimum delay is determined, each transmission line may be tuned to the common delay by reloading its clock distribution block counters 34 to the minimum delay less that transmission line's delay.

Therefore, given: B is the clock period in average digital delay line increments, M is the calculated minimum delay of a digital variable delay line, $K_i$ is the count from the ith transmission line's counter 34, $N_i$ is the count of the number of clock cycles from the ith transmission line's control logic counter 60, and C is the calculated common number of clock cycles, as discussed above, then to set all t transmission line loops to the same delay, the processor may perform the following:

a) Apply a ½ frequency clock from the clock generator 40 to the clock distribution block 30 with enables 66 high until the lock output 29 goes high, b) Apply a full frequency clock from the clock generator 40 to the clock distribution block 30 with enables 66 high until the lock output 29 goes high, c) For each transmission line i, read $K_i$, the counts from its associated clock distribution block counter 34, d) For each transmission line i, generate and read $N_i$, the contents of its associated control logic counter 60, e) For all t transmission lines, calculate the common clock cycles C=Ceiling[[max $\{B*N_0-2*K_0, \ldots, B*N_i-2*K_i, \ldots, B*N_t-2*K_t\}+2*M$]/B], f) For each transmission line i, set its associated counter 34 to $[2*K_i-B*N_i+C*B]/2$, and g) Set all control logic enables 66 high, and apply a full frequency clock from the clock generator 40 to the clock distribution block 30 until the lock output 29 goes high.

It is further contemplated that a clock frequency whose clock cycle is less than twice the round trip propagation delay on the longest transmission line 18 in FIG. 1 may not generate a feedback signal 36, and its clocks may not be properly tuned. In this case, one may align these clocks by initially tuning all the transmission lines to the same delay, as shown above, using a long clock cycle, long enough to generate a feedback signal, and thereafter to only retune a transmission line when a system driven by that transmission line does not need the clock. That is, the following process may be employed:

a) Using the process above, and a clock having a sufficiently long clock cycle, as explained above, set all transmission lines to the same delay, b) Turn off all the enable signals 66, apply a full frequency clock (i.e., a clock having a normal clock cycle for the particular application), and.

c) If a target chip disables its clock input:
 1. Set the control logic enable signal 66 corresponding to the disabled clock input high,
 2. Apply a clock having a long clock cycle (again, as explained above) from the clock generator 40 to the source clock 37 corresponding to the disabled clock input until the lock output 29 goes high,
 3. Set the control logic enable signal 66 corresponding to the disabled clock input low, and 4. Apply a normal frequency clock (i.e., one having a normal clock cycle as appropriate to the application) to the source clock 37, and d) Repeat step c) until system is reset or powered down.

As mentioned earlier, it is further contemplated that the synchronized signals may be regularly repeating digital signals, not just clock signals.

It is also contemplated that point to point transmission lines may be tuned to send and receive data signals, as well as sending clock signals, and that the tuned input and output data lines may be used to further detect variations and adjust timing of the corresponding target chips by adjusting their power supply voltages. Such capability may be useful to align chips with performance variations.

Figure 11:
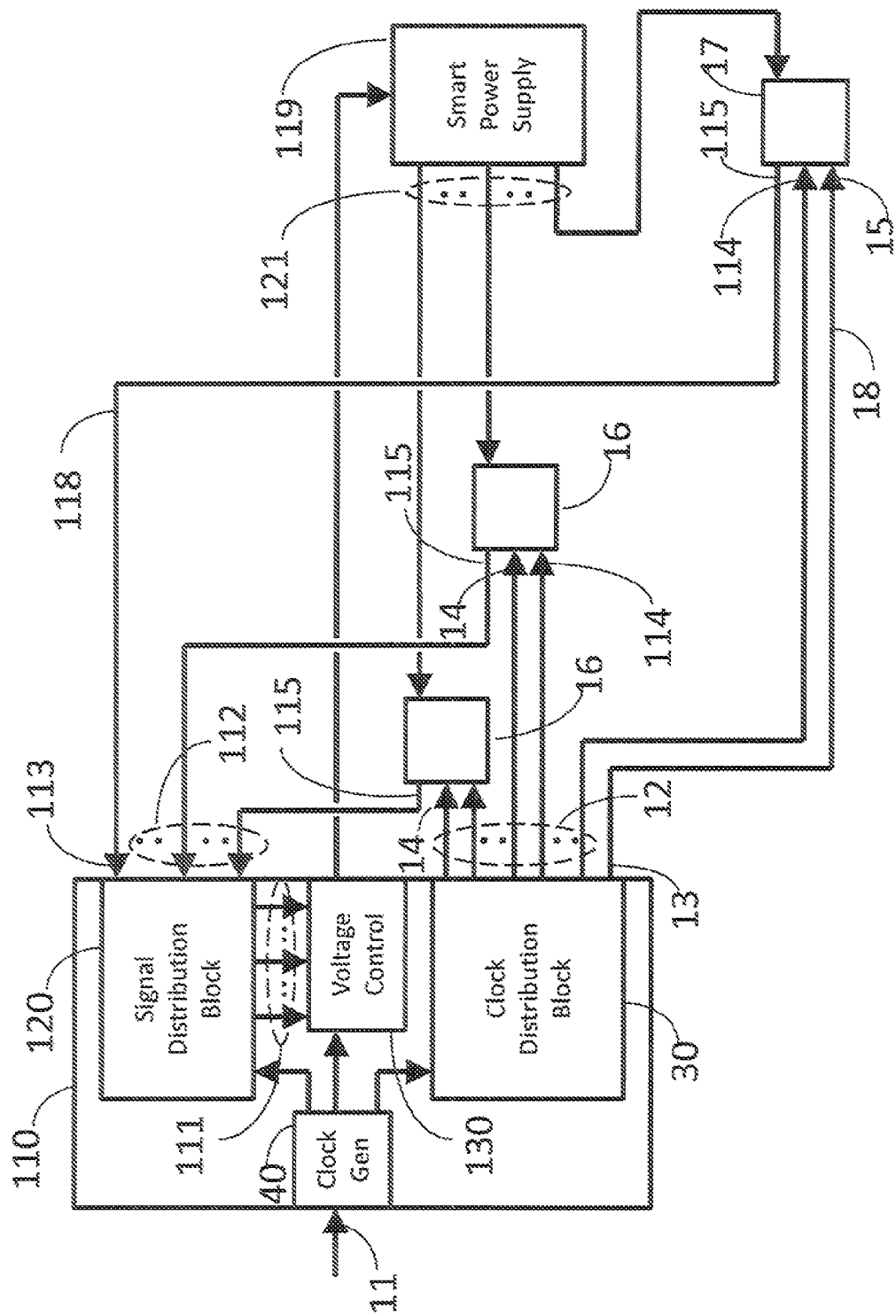
FIG. 11 is a diagram of a source chip containing a signal distribution block with data returning on its connections to a plurality of target chips, in accordance with a disclosed embodiment.

Reference is now made to FIG. 11, a diagram of a source chip containing a signal distribution block with data returning on its connections to a plurality of target chips, in accordance with a disclosed embodiment. A source chip 110 containing a signal distribution block 120 may receive a master clock on its input 11 from which clocks may be generated in the clock generator block 40. The generated clocks may be distributed to other blocks in the source chip including a voltage control block 130, a clock distribution block 30, and a signal distribution block 120, which may distribute signals to outputs 112,113 and on through point to point un-terminated transmission lines to the target chips 16,17. The reflected signals from the pins 115 of a plurality of target chips 16,17 may then be used to tune the delay of the reflected signals as described in other embodiments above. Thereafter the target chips 16,17 may send signals with aligned delays back to the chip 110 via the signal distribution block 120.

Figure 12:
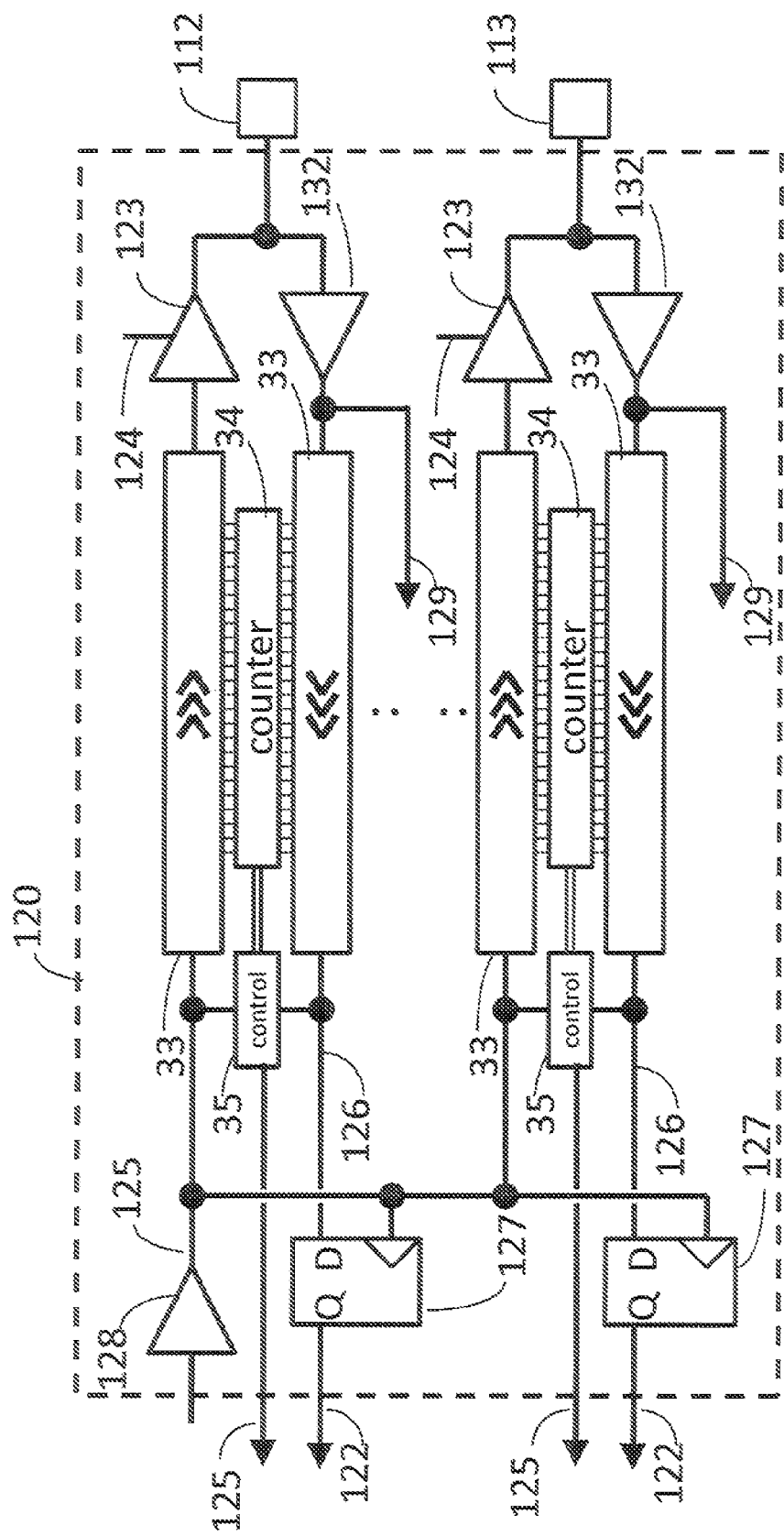
FIG. 12 is a top level diagram of the signal distribution block according to a disclosed embodiment.

Reference is now made to FIG. 12, a top level diagram of a signal distribution block 120 according to a disclosed embodiment. Following the tuning of the point to point transmission lines connected to pins 112, 113, by one of the methods described above, the signals on the feedback lines 126 may be aligned to the distributed master signal 125, at least to within some tolerance, which may be, e.g., predetermined or user-determined. Thereafter, the tri-state output buffers 123 may be set to high impedance by a control signal 124, to receive data signals in the source chip, which may be generated in the target chips and may be captured by the latches 127 connected to the feedback lines. Since all the point to point transmission lines may be aligned, the delays of the data signals from the target chips to the latches 127 may be equal to half the delays from the master signal lines, to the plurality of target chip pins, and back to the feedback lines 126.

In other words, to synchronize the reception of signals in a source chip from a plurality of target chips through multiple point to point transmission lines of varying lengths, the following process may be employed:

a. align the delays of signals from the source chip through the multiple transmission lines to the plurality of target chip pins and back to the source chip through the multiple transmission lines;

b. disconnect the source chip outputs to the multiple transmission lines; and c. capture signals at the source chip through the multiple transmission lines from the plurality of target chips.

Reference is again made to FIG. 11. The plurality of target chips 16,17 may be identical copies of one type of chip. After aligning the clock signals at pins 15,14, aligning the source chip output signals at pins 114 and aligning the source chip input signals 112,113 at pins 115, it may be possible to perform a synchronized test function in each of the identical target chips, which may output signal transitions that may be captured in the latches 127 in FIG. 12. Thereafter, the transitions may be propagated via signal lines 111, from outputs 122 and 125 in FIG. 12, to a voltage control block 130, which may control supply voltages of the target chips via power lines 121. The voltage control block 130 may include a processor, which may interpret the transitions and signal a smart power supply 119 to incrementally increase the supply voltage to slower chips and/or decrease the supply voltage to faster chips, and this may be done, e.g., until all the test function signal transitions are synchronized, at least to within some predetermined or user-determined tolerance. For example, if some of the target chips are too slow, their outputted transitions may not be captured. In this case, the operating speeds/clocks of such target chips may be controlled to be increased, or operating speeds/clocks of faster ones of the target chips may be controlled to be decreased. In one embodiment, the voltage control block 130 may instruct the smart power supply 119 to raise the voltages on the slow chips when the existing voltages may be in some acceptable range, or the voltage control block 130 may instruct the smart power supply 119 to lower the voltages on the fast chips when the existing voltages exceed some acceptable range, which may then require an additional clock cycle to obtain the next transitions from all the chips, or a slower clock frequency. In either case, this process may be repeated until the desired test function signal transitions are synchronized (which may, again, be to within some tolerance).

In other words, to synchronize signals between a source chip and a plurality of target chips through multiple point to point transmission lines of varying lengths, the following process may be employed:

a. align the delays of signals from the source chip through the multiple transmission lines to the plurality of target chips and back to the source chip through the multiple transmission lines;

b. disconnect the source chip outputs from a first portion of the multiple transmission lines;

c. transmit signals from the source chip through a second portion of the multiple transmission lines to the plurality of target chips;

d. capture signals at the source chip through the first portion of multiple transmission lines from the plurality of target chips;

e. analyze the alignment of the captured signals;

f. change target chips' voltages, or otherwise adjusting an operating speed of one or more of the target chips; and g. repeat steps c, d, e, and f until the captured signals are aligned.

It is further contemplated that respective portions of the multiple transmission lines may convey groups of similar signals, and each group of signals may comprise one signal for each similar input/output (I/O) on each of the plurality of identical target chips.

Also, in a manner similar to previous methods, this alignment process and voltage adjustment may be performed whenever either the target chips may be idle or following operational failures, which may occur due to target chips drifting out of alignment. It should be noted that if all the multiple transmission lines are aligned together, they may all have the same transmission delays. Alternatively, each portion and/or each group of similar signals within a portion of the multiple transmission lines may be separately aligned. Furthermore, to more efficiently synchronize the signals from the plurality of identical target chips, the frequency of the master clock or repeating master signal may vary for each group of multiple transmission lines with similar signals.

More specifically, at least one similar group may comprise one clock signal for each of the plurality of identical target chips, the identical target chips may be memory chips, the other similar groups may comprise address, control, data in and/or data out signals, and the test functions may generate alternating ones and zeros.

Alternatively, following the tuning of each of the similar groups, a processor within the voltage control block 130 in FIG. 11 may acquire the contents of the counters 34 in FIGS. 3 and 12, may compute variations in delays for similar groups, and then may adjust the master clock frequencies, the counters and/or the voltages of one or more of the target chips to maximize the performance of the entire plurality of target chips, which may allow the output from the plurality of target chips to be captured directly from the outputs 129 of the input buffers 132 in the signal distribution block 120 shown in FIG. 12.

In this manner it may be possible to align the signals to and from a plurality of identical target chips, such as memory chips, which may have no internal mechanisms for tuning and may externally synchronize and optimize the performance of the entire plurality of target chips.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. A method of synchronizing the reception of signals in a source chip from a plurality of target chips through multiple point to point transmission lines of varying lengths, comprising:
   a. aligning the delays of signals from the source chip through the multiple transmission lines to the plurality of target chips and back to the source chip through the multiple transmission lines;
   b. disconnecting the source chip outputs to the multiple transmission lines; and
   c. capturing signals at the source chip through the multiple transmission lines from the plurality of target chips.

2. A method of synchronizing signals between a source chip and a plurality of target chips through multiple point to point transmission lines of varying lengths, comprising:
   a. aligning the delays of signals from the source chip through the multiple transmission lines to the plurality of target chips and back to the source chip through the multiple transmission lines;
   b. disconnecting outputs of the source chip from a first portion of the multiple transmission lines;
   c. transmitting signals from the source chip through a second portion of the multiple transmission lines to the plurality of target chips;
   d. capturing signals at the source chip through the first portion of multiple transmission lines from the plurality of target chips;
   e. analyzing alignment of the captured signals;
   f. changing one or more operating speeds of one or more of the plurality of target chips; and
   g. repeating c, d, e, and f until the captured signals are aligned.

3. The method as in claim 2, wherein the plurality of target chips are identical.

4. The method as in claim 3, wherein the plurality of target chips are memory chips.

5. The method as in claim 2, wherein the plurality of target chips in step d are performing a same test function.

6. The method as in claim 5, wherein the test function generates alternating ones and zeros.

7. The method as in claim 2, wherein each of the plurality of target chips is connected to at least one of the first portion of multiple transmission lines and at least one of the second portion of multiple transmission lines.

8. The method as in claim 2, wherein the changing one or more operating speeds of one or more of the plurality of target chips comprises adjusting one or more voltages of the one or more of the plurality of target chips.

* * * * *